United States Patent
Shimada et al.

(10) Patent No.: US 8,736,024 B2
(45) Date of Patent: May 27, 2014

(54) SEMICONDUCTIVE CERAMIC SINTERED COMPACT

(71) Applicant: Toto Ltd., Kitakyushu (JP)

(72) Inventors: Shogo Shimada, Kanagawa-ken (JP); Yasutaka Ushijima, Kanagawa-ken (JP); Atsushi Teramoto, Kanagawa-ken (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 13/690,183

(22) Filed: Nov. 30, 2012

(65) Prior Publication Data

US 2013/0140679 A1    Jun. 6, 2013

(30) Foreign Application Priority Data

Dec. 2, 2011 (JP) .................................. 2011-264389
Sep. 20, 2012 (JP) .................................. 2012-206882

(51) Int. Cl.
*H01L 29/12* (2006.01)
*C04B 35/00* (2006.01)

(52) U.S. Cl.
USPC .......................................... 257/613; 501/133

(58) Field of Classification Search
USPC ................................... 257/613; 428/34.4
See application file for complete search history.

(56) References Cited

U.S. PATENT DOCUMENTS

| 3,791,833 A | 2/1974 | Sugiura et al. |
| 4,714,640 A * | 12/1987 | Morgan ....................... 428/34.4 |
| 7,091,146 B2 | 8/2006 | Okiyama et al. |
| 7,247,588 B2 | 7/2007 | Kwon et al. |
| 7,253,869 B1 * | 8/2007 | Russell et al. ................ 349/158 |
| 2010/0234207 A1 | 9/2010 | Shikata et al. |

FOREIGN PATENT DOCUMENTS

| EP | 1 538 132 A1 | 6/2005 |
| JP | 09-268060 A | 10/1997 |
| JP | 2004-099413 A | 4/2004 |
| JP | 2008-266069 A | 11/2008 |
| JP | 2011-068561 A | 4/2011 |

* cited by examiner

*Primary Examiner* — Lex Malsawma
(74) *Attorney, Agent, or Firm* — Carrier Blackman & Associates, P.C.; Joseph P. Carrier; William D. Blackman

(57) ABSTRACT

There is provided a semiconductive ceramic sintered compact that has a conductivity high enough to attain static electricity removal and antistatic purposes and, at the same time, has excellent mechanical properties or stability over time. The semiconductive ceramic sintered compact includes a main phase and a conductive phase, wherein the main phase is a ceramic sintered phase including $Al_2O_3$ particles, the area ratio of the conductive phase to the main phase is 0% (exclusive) to 10% (inclusive), and the conductive phase includes two or more metals selected from Mn (manganese), Fe (iron), and Ti (titanium) and has a composition meeting a relation of $Mn/(Ti+Mn+Fe) > 0.08$ or $Mn/Ti > 0.15$.

14 Claims, 3 Drawing Sheets

SEMICONDUCTIVE CERAMIC SINTERED COMPACT

BACKGROUND OF THE INVENTION

1. Field of Invention

The present invention relates to a semiconductive ceramic sintered compact that has a conductivity high enough to attain static electricity removal and antistatic purposes and has excellent mechanical properties or stability over time.

2. Background Art $Al_2O_3$, $ZrO_2$, SiC, $Si_3N_4$ and the like have been extensively used as structural members for semiconductor manufacturing apparatuses and liquid crystal manufacturing apparatuses by virtue of their excellent mechanical properties, abrasion resistance, and corrosion resistance. In particular, $Al_2O_3$ possesses excellent mechanical properties, abrasion resistance, and corrosion resistance and is low in cost and thus has been used in various portions of apparatuses.

An enhanced performance of semiconductor devices and liquid crystal devices in recent years has led to further microminiaturization of these devices, posing troubles of the devices caused by electrostatic discharge (ESD) that occurs in guides or the like during drive of stages in a manufacturing process. Further, static electricity should be rapidly released from around the devices. To meet this demand, ceramics, of which the surface resistivity and the volume resistivity have been lowered by adding conductive substances to alumina that is an insulator, or by using a special sintering method for static electricity removing and antistatic purposes, have hitherto been known (PTLs 1 to 4).

For example, JP 2004-099413 (PTL 4) discloses alumina ceramics that have antihalation and antistatic functions and have a specific rigidity which can maintain a large meter-size mount table with high accuracy. The ceramics include $Al_2O_3$ and three metal elements of Mn (manganese), Ti (titanium), and Fe (iron) each added in an amount of not less than 0.5% in terms of oxide to $Al_2O_3$, the total amount of the three elements being 2 to 11% in terms of oxide. As long as the present inventors know, the ceramics described in this patent publication leave room for an improvement in properties.

CITATION LIST

Patent Literature

[PTL 1] JP 2008-266069
[PTL 2] JP 2011-68561
[PTL 3] JP H09 (1997)-268060
[PTL 4] JP 2004-099413

SUMMARY OF THE INVENTION

Technical Problems

The present inventors have now found that a semiconductive ceramic sintered compact including a main phase containing $Al_2O_3$ particles and a conductive phase the main phase being a ceramic sintered phase including $Al_2O_3$ particles, the conductive phase having a specific area ratio to the main phase, the conductive phase including a specific conductive substance in a specific proportion, has various excellent properties, specifically a conductivity high enough to attain static electricity removal or antistatic purposes and has excellent mechanical properties or stability over time.

Accordingly, an object of the present invention is to provide a semiconductive ceramic sintered compact having excellent various properties, particularly a semiconductive ceramic sintered compact that has a conductivity high enough to attain static electricity removal or antistatic purposes and, at the same time, has excellent mechanical properties or stability over time.

Accordingly, an object of the present invention is to provide a semiconductive ceramic sintered compact having excellent various properties, particularly a semiconductive ceramic sintered compact that has a conductivity high enough to attain static electricity removal or antistatic purposes and, at the same time, has excellent mechanical properties or stability over time.

Solution to Problems

According to the present invention, there is provided a semiconductive ceramic sintered compact comprising:

a main phase and a conductive phase present between the main phases, wherein the main phase is a ceramic sintered phase comprising $Al_2O_3$ particles, the area ratio of the conductive phase to the main phase is 0% (exclusive) to 10% (inclusive), and the conductive phase comprises two or more metals selected from Mn (manganese), Fe (iron), and Ti (titanium) and has a composition meeting a relation of $Mn/(Ti+Mn+Fe) > 0.08$ or $Mn/Ti > 0.15$.

Effects of the Invention

The present invention provides a semiconductive ceramic sintered compact that has a conductivity high enough to attain static electricity removal or antistatic purposes and, at the same time, has excellent mechanical properties or stability over time. The provision of the above semiconductive ceramic sintered compact can contribute to the suppression of ESD that is a problem involved in liquid crystal manufacturing apparatuses, semiconductor manufacturing apparatuses and the like and can meet microminiaturization and increase in size of devices. Further, according to the present invention, the sintered compact can be densified by sintering at ordinary atmospheric pressure, and, thus, homogeneous and low-cost dense sintered compacts can be prepared, offering an advantage that the sintered compact does not undergo a change in accuracy of planar parallelism over time.

DESCRIPTION OF EMBODIMENTS

Figure 1:
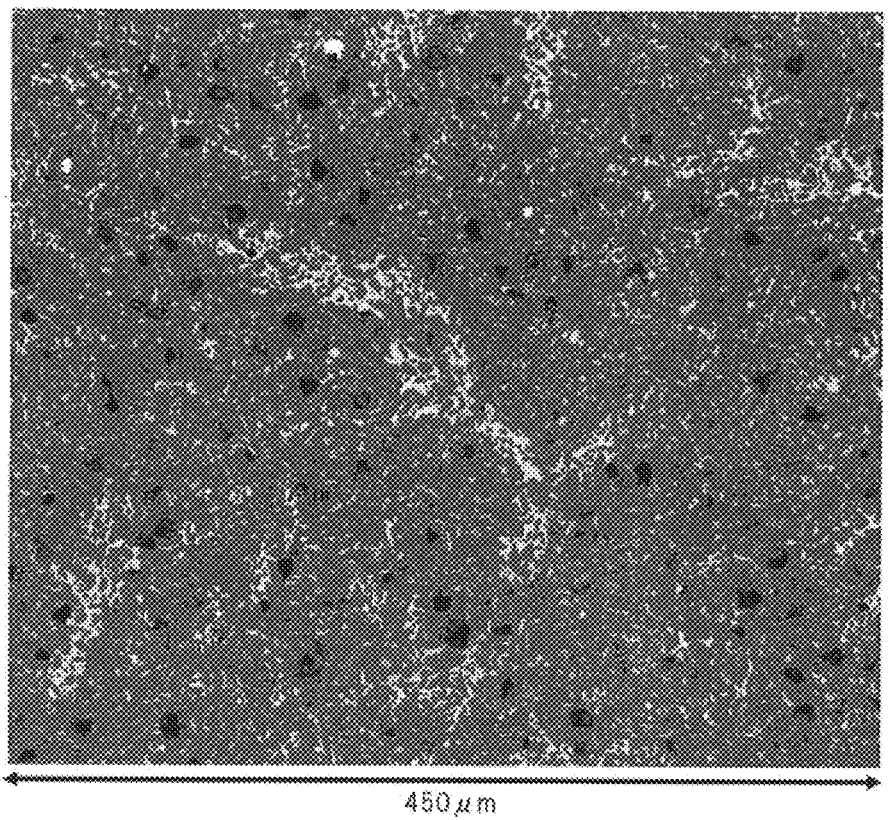
FIG. 1 is an image photographed under a laser microscope showing a microstructure of a semiconductive ceramic sintered compact according to the present invention prepared in Example 1.

The semiconductive ceramic sintered compact according to the present invention will be described.

Semiconductive Ceramic Sintered Compact

The semiconductive ceramic sintered compact according to the present invention includes: a main phase and a conductive phase present between the main phases, wherein the main phase is a ceramic sintered phase including $Al_2O_3$ particles, the area ratio of the conductive phase to the main phase is 0% (exclusive) to 10% (inclusive), and the conductive phase includes two or more metals selected from Mn (manganese), Fe (iron), and Ti (titanium) and has a composition meeting a relation of $Mn/(Ti+Mn+Fe) > 0.08$ or $Mn/Ti > 0.15$.

The area ratio of the conductive phase to the main phase can be obtained, for example, as described above, using an image of a microstructure photographed under a laser microscope or an electron microscope of the semiconductive ceramic sintered compact. "Proportion of the components in the conductive phase" means the ratio of presence of individual elements (number of individual elements) obtained by an elementary analysis (=atomic %), for example, by energy dispersive X-ray fluorescence diffractometry (EDX).

The area ratio of the conductive phase is preferably 0.5% (exclusive) to 4% (inclusive). When the area ratio of the conductive phase is less than 10%, a good balance between the conductivity and the mechanical properties of the ceramic sintered compact can be ensured. Further, the component ratio of the conductive phase meets a relation of $Mn/(Ti+Mn+Fe) > 0.08$ or $Mn/Ti > 0.15$, preferably $Mn/(Ti+Mn+Fe) > 0.1$ or $Mn/Ti > 0.2$, still more preferably $Mn/(Ti+Mn+Fe) > 0.15$ or $Mn/Ti > 0.25$. When the component ratio meets a relation of $Mn/(Ti+Mn+Fe) > 0.08$ or $Mn/T\ i > 0.15$, a conductivity high enough to attain static electricity removal or antistatic purposes is developed and the sintered compact is densified.

The conductive phase may take any form of a crystal phase, a mixture composed of a crystal phase and an amorphous phase, and an amorphous phase.

The conductive phase contained in the semiconductive ceramic sintered compact according to the present invention is present between the main phases. The expression "present between the main phases" means an embodiment where, when any face of the semiconductive ceramic sintered compact according to the present invention is observed, the conductive phase is present on the face (in the main phases), an embodiment where, when the semiconductive ceramic sintered compact according to the present invention is three-dimensionally observed, the conductive phase is three-dimensionally present in the space (between the main phases), a combination of the above embodiments, and other embodiments where the conductive phase is present in the ceramic sintered compacts.

The semiconductive ceramic sintered compact according to the present invention has a conductivity high enough to attain static electricity removal or antistatic purposes and has excellent mechanical properties or stability over time and thus can be advantageously used in any embodiment or form of presence of the conductive phase in the ceramic sintered compact, as long as the area ratio of the conductive phase to the main phase is 0% (exclusive) to 10% (inclusive) and the conductive phase contains two or more metals selected from Mn, Fe, and Ti and has a composition meeting a relation of $Mn/(Ti+Mn+Fe) > 0.08$ or $Mn/Ti > 0.15$.

Further, according to another aspect of the present invention, there is provided a semiconductive ceramic sintered compact including: at least a main phase and first and second phases contained in the main phase observed as a result of observation of any face of the sintered compact, the first phase being a grain boundary phase including a conductive substance-containing conductive phase and $Al_2O_3$ particles, the $Al_2O_3$ particles being present in an island-sea form in the conductive phase, the second phase being a grain boundary phase containing a conductive phase having the same composition as the conductive phase in the first phase and having a structure that electrically connects the first phases three-dimensionally to each other. When the semiconductive ceramic sintered compact according to this aspect of the present invention takes this structure, portions where $Al_2O_3$ particles prepare necks are formed. Consequently, a conductive path is formed from a relative small amount of the conductive phase. Further, mechanical properties of the sintered compact are improved.

First Phase

In this aspect of the present invention, the first phase is a grain boundary phase that is present in the main phase and includes a conductive substance-containing conductive phase and $Al_2O_3$ particles, the $Al_2O_3$ particles being present in an island-sea form in the conductive phase. Specifically, the first phase is a phase present in a center portion of FIG. 1. In FIG. 1, a light gray portion is the conductive phase, and a dark gray portion present like islands in the conductive phase is $Al_2O_3$ particles. Accordingly, the term "island-sea" as used herein means such a state that dispersed phases (island component) are dispersed in a continuous phase (sea component). The sea component is a conductive phase including a conductive substance, and the island component is $Al_2O_3$ particles.

Second Phase

Further, in this aspect of the present invention, the second phase is a grain boundary phase that is present in the main phase including $Al_2O_3$ particles, has a conductive phase having the same composition as the conductive phase in the first phase and has a structure that electrically connects the first phases three-dimensionally to each other. The conductive phase has an ant's nest-like distribution. When any face of the sintered compact according to the present invention is observed, a three-dimensionally thin portion in the conductive phase has a distribution as in the second phase and is seen as discrete spots. A light gray portion present as spots in a phase which is shown as a dark gray portion in FIG. 1 and in which $Al_2O_3$ particles are bound to each other is a conductive phase. A gray portion intermediate between the light gray portion and the dark dray portion is a glass phase formed of $SiO_2$.

Preferably, the semiconductive ceramic sintered compact in one embodiment according to the present invention has a conductive phase containing Fe (iron) and Ti (titanium). When Fe and Ti are contained, a conductivity high enough to attain static electricity removal and antistatic purposes can be developed in a small addition amount.

In the semiconductive ceramic sintered compact in one embodiment of the present invention, preferably, the conductive phase further contains Mn (manganese). When Mn is contained, effective conductivity is developed and the sintered compact is densified.

In the semiconductive ceramic sintered compact in one embodiment of the present invention, preferably, the conductive phase contains Mn and Ti. When Mn and Ti are contained, a conductivity high enough to attain static electricity removal and antistatic purposes is developed in a small addition amount.

In the semiconductive ceramic sintered compact in one embodiment of the present invention, the conductive phase may further contain a sintering assistant in such an amount that can maintain the good conductivity. Examples of such sintering assistants include $SiO_2$, MgO, or CaO which will be described later.

In the semiconductive ceramic sintered compact in one embodiment of the present invention, when the conductive phase takes a form of a crystal phase, the conductive phase may contain crystals having an ilmenite structure. Although a plurality of compounds take an ilmenite structure, the precipitation of $FeTiO_3$, $MnTiO_3$, and $Mn_xFe_{1-x}TiO_3$ compounds is preferred.

Further, in the semiconductive ceramic sintered compact according to one embodiment of the present invention, when the conductive phase takes a form of an ilmenite crystal phase, as measured by X-ray diffractometry of a sample obtained by pulverizing the semiconductive ceramic sintered compact, mixing the powder with 1% by weight of a Si (silicon) powder having a purity of 99.9999% or more, a value obtained by dividing a peak area at 32° by a peak area at 28° and multiplying the obtained value by 100 may be not less than 40. When the conductive phase takes the form of an ilmenite crystal phase, effective conductivity is developed when the peak area ratio is not less than 40.

In the semiconductive ceramic sintered compact in one embodiment of the present invention, the surface resistivity is preferably not more than $10^{13}$ [$\Omega$/sq.], more preferably $10^5$ [$\Omega$/sq.] to $10^{13}$ [$\Omega$/sq.], still more preferably $10^7$ [$\Omega$/sq.] to $10^{13}$ [$\Omega$/sq.]. When the surface resistivity is not less than $10^5$ $\Omega$/sq., instantaneous neutralization of charges electrified to materials is prevented and, consequently, the possibility of disadvantageously generating discharge can be suppressed. When the surface resistivity is not more than $10^{13}$ $\Omega$/sq., it is possible to prevent the material from being brought to a state close to an insulator and to prevent charges from staying in the material.

In the semiconductive ceramic sintered compact in one embodiment of the present invention, preferably, the specific rigidity is not less than 60 [GPa], more preferably not less than 70 [GPa]. When the specific rigidity is not less than 60 [GPa], the flexibility of the structure is not increased and the accuracy required of the sintered compact can be obtained.

In the semiconductive ceramic sintered compact in one embodiment of the present invention, the water absorption coefficient is preferably not more than 0.1%, more preferably not more than 0.05%. When the water absorption coefficient is not more than 0.1%, the accuracy required of the sintered compact can be obtained.

By virtue of excellent static electricity removing or antistatic properties and mechanical properties or stability over time, the semiconductive ceramic sintered compact according to the present invention can be advantageously used, for example, in structural members used in semiconductor manufacturing apparatuses or liquid crystal manufacturing apparatuses (more specifically stages in semiconductor device or liquid crystal manufacturing apparatuses, and drive guides), and various mechanical components, tools, guides and the like that are required to have mechanical properties and have complicated shapes required to be machined by electric discharge.

Manufacturing Method

The method for manufacturing a semiconductive ceramic sintered compact according to the present invention will be described. For $MnO_2$, $Fe_2O_3$, and $TiO_2$ that are starting materials for the conductive substance, preferably, the three starting materials have a purity of not less than 95% and have a mean particle diameter of not more than 5 μm, more preferably not more than 3 μm, still more preferably not more than 1 μm. For a sintering mechanism of the semiconductive ceramic sintered compact according to the present invention, liquid phase sintering is preferred, and, in a mean particle diameter of more than 5 μm, the conductive substance portion, when converted to a liquid phase, allows the liquid phase to be diffused into the molded product to form residual pores. The total addition amount of the three starting materials is preferably not more than 25% by weight, more preferably not more than 23% by weight, still more preferably not more than 21% by weight. When the total addition amount is not more than 25% by weight, the mechanical properties are not lowered and, at the same time, a difference in coefficient of thermal expansion between the conductive phase and $Al_2O_3$ as the main phase can eliminate a possibility of the occurrence of residual stress or cracking.

Preferably, $SiO_2$ is added as a sintering aid. Preferably, $SiO_2$ has a mean particle diameter of not more than 5 μm. The mean particle diameter is more preferably not more than 3 μm, still more preferably not more than 1 μm. When the mean particle diameter is not more than 5 μm, as with the conductive substance, $SiO_2$ also constitutes a liquid phase component and, thus, there is no possibility of occurrence of pores. The addition amount is preferably not more than 10% by weight, more preferably not more than 8% by weight, still more preferably not more than 6% by weight. When the addition amount is not more than 10% by weight, the mechanical properties are not lowered and a difference in coefficient of thermal expansion between the conductive phase and $Al_2O_3$ as the main phase can allow the occurrence of residual stress and cracking to be suppressed.

In a preferred embodiment of the present invention, preferably, the $Al_2O_3$ starting material for constituting the main phase has a purity of not less than 95%. The addition amount is a value (a balance) obtained by subtracting the amount of the conductive substance starting material and the amount of the $SiO_2$ starting material as the sintering aid from the composition. The use of two types of $Al_2O_3$ starting materials having mutually different mean particle diameter is preferred. For example, an $Al_2O_3$ starting material having a mean particle diameter of not less than 2 μm and an $Al_2O_3$ starting material having a mean particle diameter of not more than 1 μm may be used. The use of an $Al_2O_3$ starting material having a larger mean particle diameter of not less than 2 μm and an $Al_2O_3$ starting material having a smaller mean particle diameter of not more than 1 μm can contribute to an improved volume packing ratio of the solid content in the molded product and can realize excellent static electricity removing or antistatic properties in a small proportion of the conductive phase. The addition ratio between the $Al_2O_3$ starting material having a larger mean particle diameter and the $Al_2O_3$ starting material having a smaller mean particle diameter is that preferably not less than 50% of the total amount of $Al_2O_3$ is accounted for by the $Al_2O_3$ starting material having a larger mean particle diameter. When the addition ratio of the $Al_2O_3$ starting material having a larger mean particle diameter is not less than 50%, advantageously, the packing ratio in the molded product can be improved and, further, the $Al_2O_3$ particles having a smaller mean particle diameter start sintering at a low temperature, whereby pores that are deemed to derive from a heterogeneous conductive phase can also be suppressed.

Preferably, these starting materials, a solvent, and a dispersant are added and ground and mixed in a ball mill, and the mixture is granulated with a spray dryer or the like. In the grinding and mixing, desirably, the conductive substance, the sintering aid, and the $Al_2O_3$ starting material having a smaller particle diameter are firstly introduced followed by preliminary grinding. This method can facilitate the formation of a conductive phase having a homogeneous composition. Preferably, the prepared granulated powder is subjected to pressing and CIP molding to prepare a molded product. Alternatively, the molded product may be prepared by casting or extrusion. The molded product may be sintered in the atmospheric environment by holding the molded product at a maximum temperature of 1200 to 1500° C. for 1 to 10 hr. Sintering in the atmospheric environment is preferred. The sintering in the atmospheric environment may be carried out in any of an electric furnace and a furnace using a fuel such as LPG.

EXAMPLES

For starting materials in Examples 1 to 10 and Comparative Examples 1 and 2, 2.1 to 7.5% by weight of a commercially available $MnO_2$ starting material having a mean particle diameter of 5 μm, 2.1 to 4.5% by weight of a commercially available $Fe_2O_3$ starting material having a mean particle diameter of 2 μm, and 0.7 to 4.5% by weight of a commercially available $TiO_2$ starting material having a mean particle diameter of 0.5 μm were added as conductive substances, 2 to 6% by weight of a $SiO_2$ starting material having a mean particle diameter of 2 μm was added as a sintering aid, and a commercially available $Al_2O_3$ starting material having a mean particle diameter of 0.5 μm and a commercially available $Al_2O_3$ starting material having a mean particle diameter of 3 μm were added as the balance. For starting materials in Example 11, in addition to the above starting materials, 0.5% by weight of a MgO starting material having a mean particle diameter of 2 μm was added. For starting materials in Example 12, in addition to the above starting materials, 0.5% by weight of a CaO starting material having a mean particle diameter of 5 μm was added. For starting materials in Comparative Example 3, in addition to the above starting materials, 0.4% by weight of a MgO starting material having a mean particle diameter of 2 μm and 0.7% by weight of a CaO starting material having a mean particle diameter of 5 μm were added.

The starting materials, ion-exchanged water, and a dispersant (polycarboxylic ammonium) were placed in a ball mill and were ground and mixed for 20 hr. An acrylic binder was added and mixed therewith for a few minutes, and the slurry was taken out and deaerated. The deaerated slurry was cast into a plaster mold that can provide a green body having a size of 100 mm square and a thickness of 10 mm, followed by the preparation of a green body. The surface layer of the demolded and dried green body was polished with an abrasive material of #80, and polished green body was atmospherically sintered at 1300 to 1450° C. The sintered products thus prepared were subjected to the measurement of the area ratio of a conductive phase in a sintered compact under a laser microscope, a compositional analysis of a conductive phase in a sintered compact under SEM, the measurement of surface resistivity, the measurement of specific rigidity, and the measurement of water absorption coefficient by the following evaluation methods. The results of evaluation are shown in Table 1.

Evaluation Test
Area Ratio of Conductive Phase in Sintered Compact

The analysis for the determination of the area ratio of the conductive phase in the sintered compact was carried out under a laser microscope. OLS4000 manufactured by Shimadzu Seisakusho Ltd. was used as the laser microscope. The observation was made in an area of 480 μm×480 μm, and a brightness image in this area was photographed. The conductive phase contains a transition metal and thus exhibits a high brightness, and, thus, a high-brightness portion can be separated as the conductive phase by an image analysis. WinROOF V6.5 was used for the image analysis. Images obtained under the laser microscope were monochromated, the conductive phase was separated by digitization at a monochromatic threshold of 170 to 210 to determine the area ratio. The area ratio was determined as a proportion of the area of the conductive phase to the total area excluding the area of a pore portion. Regarding conditions for the preparation of samples, mirror polishing was adopted as in the observation under EFM.

Compositional Analysis of Conductive Phase in Sintered Compacts

The composition of the conductive phase in the sintered compact was analyzed under a scanning electron microscope. Quanta250 manufactured by FEI was used as the scanning electron microscope. Regarding measurement conditions, SEM observation (SE and BE) was made under conditions of an accelerated voltage of 10 kV, a working distance of 10 mm, a spot of 4, and a magnification of 2000 times, and EDS analysis was carried out under conditions of an accelerated voltage of 10 kV, a working distance of 10 mm, a spot of 7, a magnification of 2000 times, a number of pixels of 256×220, a frame time of 2000, a rate of 4, and a drift correction zoom coefficient of 2. An analysis software NORAN SYSTEM7 manufactured by Thermo Fisher Scientific was used for the compositional analysis of the conductive phase. Images photographed at the above magnification was subjected to an elemental mapping analysis. Phases were separated based on the component ratio and the component ratio of the phase corresponding to the conductive phase was obtained. Regarding conditions for the preparation of samples, mirror polishing was performed in the same manner as in the observation under EFM, followed by platinum vapor deposition to prepare samples.

Method for Identifying Crystal Phase in Sintered Compact

The determination of whether or not the crystal phase is present in the sintered compacts and the identification of the crystal phase if present in the sintered compacts may be carried out with an X-ray diffractometer. X'PertPRO manufactured by PANalytical may be used as the X-ray diffractometer. The intensity of peaks of each of the sintered compacts by X-ray diffractometry may be measured under conditions of X-ray output (CuKα radiation) of 45 kV and 40 mA, a scanning range of 27° to 34°, a scanning speed of 0.005°/sec, and a scanning time of 1 sec/0.005°. For a relative comparison of peak intensity, the following procedure may be carried out. Specifically, 1% by weight of a high-purity metal silicon powder (purity 99.9999%) is physically mixed with each sample. A peak area X is calculated from a peak intensity attributable to a (111) face of the measured metallic silicon and a half-value width of the peak, a peak area Y is calculated from a peak intensity attributable to a (104) face of ilmenite and a half-value width of the peak, and a relative area ratio is determined by multiplying Y/X by 100. The maximum peak height around each peak angle is regarded as each peak intensity.

Method for Measuring Surface Resistivity

The surface resistivity was measured with Highrester UP (MCP-HT450) manufactured by Mitsubishi Chemical Co., Ltd. The measurement was made under an environment of a measurement temperature of 23±1° C. and a humidity of not more than 50%. A UR probe (MCP-HTP12) was used as the probe for the probe measurement. Regarding measurement conditions, an applied voltage of 1000 V was adopted, and, after the application, 60 sec elapsed until a stable surface resistivity was obtained, and the stable surface resistivity was regarded as the surface resistivity. The surface resistivity was measured twice in total for obverse and reverse sides of the samples, the measured values were averaged, and the average value was regarded as the surface resistivity of the sintered compact. Regarding conditions for the preparation of samples, a thickness of 1 mm from the surface of the sintered compact was removed by grinding with a grinding stone of #80 for sample preparation.

Specific Rigidity

Young's modulus was measured by a resonance method, and specific gravity was measured by an Archimedes method. The specific rigidity was calculated by dividing the Young's modulus by the specific gravity. JE-RT3 manufactured by Nihon Techno-Plus Co., Ltd was used in the measurement of the Young's modulus. In the measurement of the specific gravity by the Archimedes method, CP224S manufactured by Sartorius was used as a balance.

Water Absorption Coefficient

The water absorption coefficient was calculated from the dry weight measured by the Archimedes method, the weight in water, and water saturated weight (a weight of the sample subjected to the measurement of the weight in water after wiping with a dry cloth; when open pores are present, the weight is larger than the dry weight), that is, was calculated by subtracting the dry weight from the water saturated weight, dividing the obtained value by the dry weight, and multiplying the obtained value by 100.

conductive phase was Mn/(Ti+Mn+Fe)>0.08 and Mn/Ti>0.15. In all the Examples, semiconductive ceramic sintered compacts having excellent surface resistivity, specific rigidity, and water absorption coefficient could be produced.

Imaging by Laser Microscope, SEM, EFM, and XRD

For Examples 1, 11, and 12, imaging was carried out by a laser microscope, SEM, EFM, and XRD.

FIG. 1 is an image of a microstructure in Example 1 that has been photographed under a laser microscope and includes a first phase and a second phase, wherein the first phase includes a conductive phase formed of a conductive substance and $Al_2O_3$ particles present in an island-sea form in the conductive phase and the second phase includes a conductive phase that has the same composition as the first phase present in the main phase formed of $Al_2O_3$ particles and has a structure which three-dimensionally connects the first phases to each other.

Figure 2:
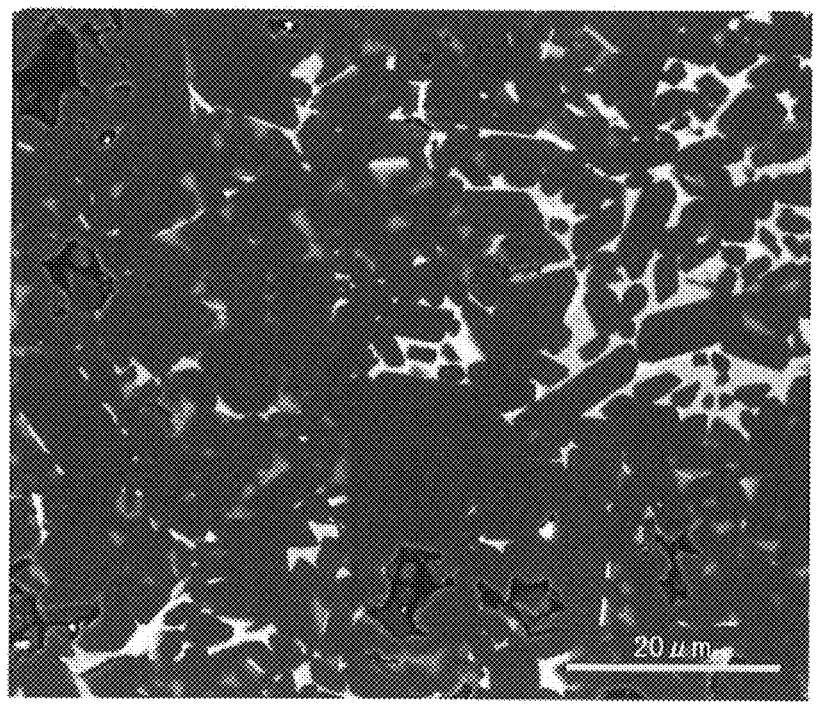
FIG. 2 is an image that has been photographed under SEM (a scanning electron microscope) and corresponds to an enlarged image of FIG. 1.

FIG. 2 is an enlarged image of FIG. 1 that has been photographed under SEM and shows a structure of the first phase.

Figure 3:
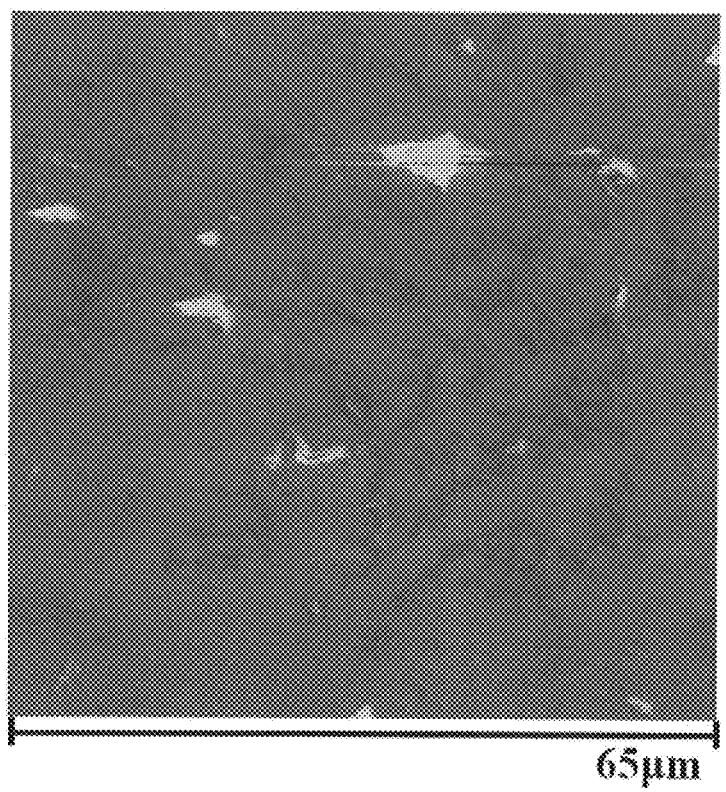
FIG. 3 is an image that has been photographed under EFM and shows a conductive path of a semiconductive ceramic sintered compact according to the present invention prepared in Example 1.

FIG. 3 is an image under EFM that shows such a state that electricity flows into the microstructure shown in FIG. 2. The image was observed by the following method.

Observation Under EFM

The conductive phase in the sintered compact was visualized under an electrical force microscope (EFM). The conductive phase in the present invention refers to a phase that allows charges to be transferred within the semiconductive ceramic sintered compact and can be observed as a leakage electric field gradient image using an electrical force micro-

TABLE 1

| | Starting materials | | | | | | | | Conductive phase [Area %] | Proportion of conductive phase | | log (surface resistivity) [Ω/α] | Specific rigidity [GPa] | Water absorption [%] |
|---|---|---|---|---|---|---|---|---|---|---|---|---|---|---|
| | $Al_2O_3$ [%] | | Other than $Al_2O_3$ | | | | | | | | | | | |
| | 0.5 μm | 3 μm | $MnO_2$ | $Fe_2O_3$ | $TiO_2$ | $SiO_2$ | MgO | CaO | Total | | Mn/(Mn + Fe + Ti) | Mn/Ti | | | |
| Example 1 | 87.0 | 0.0 | 5.0 | 3.0 | 3.0 | 2.0 | — | — | 13.0 | 2.57 | 0.24 | 0.49 | 12.29 | 71.0 | 0.011 |
| Example 2 | 81.0 | 0.0 | 7.5 | 4.5 | 4.5 | 2.0 | — | — | 18.5 | 3.87 | 0.23 | 0.53 | 11.43 | 68.1 | 0.013 |
| Example 3 | 58.1 | 24.9 | 5.0 | 3.0 | 3.0 | 6.0 | — | — | 17.0 | 1.48 | 0.17 | 0.32 | 11.49 | 73.5 | 0.008 |
| Example 4 | 60.4 | 25.9 | 3.5 | 2.1 | 2.1 | 6.0 | — | — | 13.7 | 1.25 | 0.22 | 0.47 | 12.11 | 74.8 | 0.014 |
| Example 5 | 77.7 | 8.6 | 3.5 | 2.1 | 2.1 | 6.0 | — | — | 13.7 | 1.92 | 0.25 | 0.49 | 12.05 | 74.5 | 0.015 |
| Example 6 | 74.7 | 8.3 | 5.0 | 3.0 | 3.0 | 6.0 | — | — | 17.0 | 3.25 | 0.19 | 0.39 | 11.86 | 73.7 | 0.001 |
| Example 7 | 26.1 | 60.9 | 3.0 | 3.0 | 1.0 | 6.0 | — | — | 13.0 | 1.63 | 0.24 | 0.61 | 11.95 | 77.3 | 0.012 |
| Example 8 | 9.1 | 82.0 | 2.1 | 2.1 | 0.7 | 4.0 | — | — | 8.9 | 1.58 | 0.40 | 1.12 | 11.26 | 84.8 | 0.012 |
| Example 9 | 26.7 | 62.4 | 2.1 | 2.1 | 0.7 | 6.0 | — | — | 10.9 | 1.18 | 0.41 | 1.29 | 11.10 | 77.0 | 0.021 |
| Example 10 | 8.7 | 78.3 | 3.0 | 3.0 | 1.0 | 6.0 | — | — | 13.0 | 2.33 | 0.20 | 0.47 | 11.16 | 78.7 | 0.009 |
| Example 11 | 26.5 | 62.0 | 3.0 | 3.0 | 1.0 | 4.0 | 0.5 | — | 11.5 | 1.95 | 0.12 | 0.26 | 12.34 | 78.3 | 0.002 |
| Example 12 | 26.5 | 62.0 | 3.0 | 3.0 | 1.0 | 4.0 | — | 0.5 | 11.5 | 3.11 | 0.08 | 0.20 | 11.26 | 79.6 | 0.002 |
| Comparative Example 1 | 93.0 | 0.0 | 1.0 | 3.0 | 1.0 | 2.0 | — | — | 7.0 | 0.00 | 0.07 | 0.12 | 14.25 | 81.4 | 0.011 |
| Comparative Example 2 | 87.0 | 0.0 | 1.0 | 5.0 | 3.0 | 4.0 | — | — | 13.0 | 0.00 | 0.08 | 0.15 | 14.06 | 70.2 | 0.010 |
| Comparative Example 3 | 62.0 | 26.6 | 1.3 | 2.0 | 1.1 | 6.0 | 0.4 | 0.7 | 10.4 | 2.15 | 0.07 | 0.08 | 12.39 | 71.5 | 0.181 |

In Examples 1 to 10, a crystal structure of ilmenite type was precipitated, the area of the conductive phase was 0% (exclusive) to 10% (inclusive), and the component ratio of the conductive phase was Mn/(Ti+Mn+Fe)>0.08 and Mn/Ti>0.15. The conductivity was expressed in terms of the area of the conductive phase. When look at a three-dimensional standpoint, the conductive phase was present in a proportion of 5 to 18% by volume. In Examples 11 and 12, the precipitation of the ilmenite crystal phase was hardly observed, the area of the conductive phase was 0% (exclusive) to 10% (inclusive), and the component ratio of the scope mode of an atomic force microscope (AFM). AFM manufactured by Bruker (D-3100 manufactured by DI) was used as the electrical force microscope. The observation was made in an area of 65 μm×65 μm under conditions of Analog2-6 V, a scan rate of 0.8 Hz, and a lift scan height of 1 nm. Samples were prepared by subjecting the sintered compact to mirror polishing by buffing with abrasive grains having a particle diameter of 1 μm by an automatic polishing machine manufactured by BUEHLER and ultrasonically cleaning the polished sintered compact with acetone.

Figure 4:
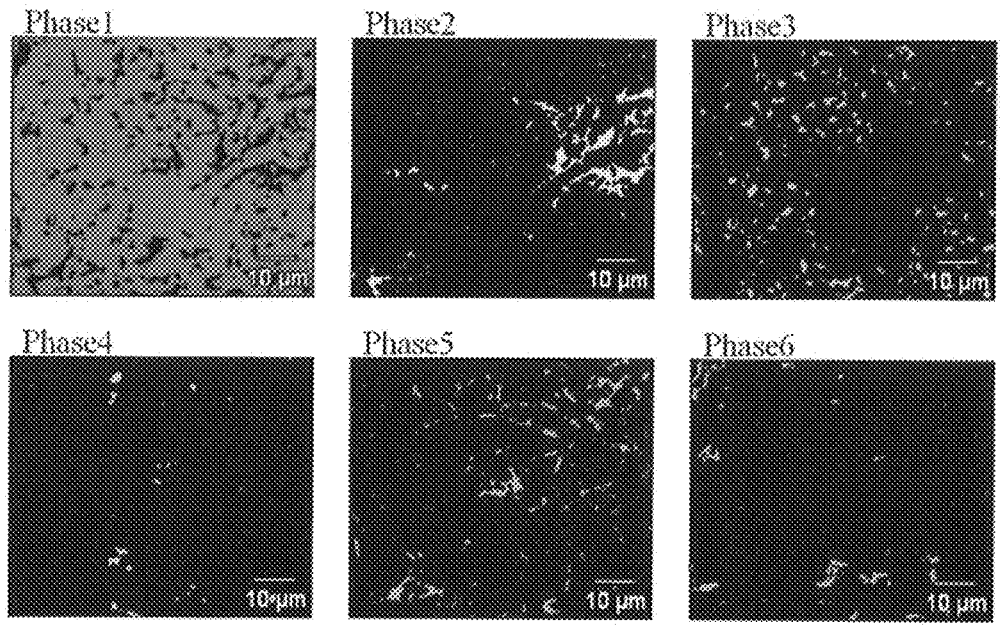
FIG. 4 is an image obtained by a compositional analysis of a semiconductive ceramic sintered compact according to the present invention prepared in Example 1.

FIG. 4 is an image obtained by subjecting the image shown in FIG. 2 to mapping for each component by energy dispersive X-ray fluorescence spectrometry (EDX). From the mapping, it is apparent that the area of the conductive phase relative to the main phase formed of $Al_2O_3$ particles is 0% (exclusive) to 10% (inclusive), two or more of Mn, Fe, and Ti were contained in the conductive phase, and the composition of the conductive phase satisfies a relation of Mn/(Ti+Mn+Fe)>0.08 or Mn/Ti>0.15. Images of individual phases (phases 1 to 6) shown in FIG. 4 will be described below, and the component ratio of the individual phases is shown in Table 2 below.

Phase 1: Phase composed of Fe-containing alumina
Phase 2: Phase that constitutes an ilmenite phase composed of Fe, Mn and Ti and contributes to conductivity.
Phase 3: Mn-rich phase
Phase 4: Phase that constitutes a spinel of Mn, Fe and also contributes to conductivity.
Phase 5: Ti-rich phase
Phase 6: Phase composed of Mn-containing alumina.

TABLE 2

| Name of element radiation | Concentration of atom [%] | | | | | |
|---|---|---|---|---|---|---|
| | Phase 1 | Phase 2 | Phase 3 | Phase 4 | Phase 5 | Phase 6 |
| CK | 1.8 | 1.46 | 1.88 | 2.01 | 1.42 | 6 |
| OK | 58.46 | 57.13 | 57.07 | 52.03 | 54.85 | 44.02 |
| FK | 0 | 0.12 | 0 | 0.41 | 0.78 | 0 |
| NaK | 0 | 0 | 0.52 | 0 | 0.1 | 0 |
| AlK | 37.22 | 17.41 | 22.42 | 22.29 | 14.22 | 44.86 |
| SiK | 0.24 | 0.2 | 9.36 | 0.53 | 0.85 | 0.92 |
| SK | 0 | 0 | 0.02 | 0 | 0 | 0 |
| CaK | 0 | 0 | 0.1 | 0 | 0 | 0 |
| TiK | 0.28 | 11.17 | 1.08 | 0.89 | 11.03 | 0.49 |
| MnK | 0.5 | 5.51 | 6.02 | 14.63 | 13 | 1.46 |
| FeL | 1.03 | 6.44 | 1.19 | 6.7 | 3.2 | 0.91 |
| CuL | 0 | 0 | 0 | 0 | 0 | 0.61 |
| GeL | 0 | 0.04 | 0 | 0 | 0.04 | 0 |
| ZrL | 0.33 | 0.32 | 0 | 0.32 | 0.33 | 0.51 |
| PtM | 0.13 | 0.19 | 0.35 | 0.19 | 0.18 | 0.21 |
| PbM | 0 | 0.01 | 0 | 0 | 0 | 0.02 |
| TiM | 0.02 | 0 | 0 | 0 | 0 | 0 |
| Total | 100 | 100 | 100 | 100 | 100 | 100 |

Figure 5:
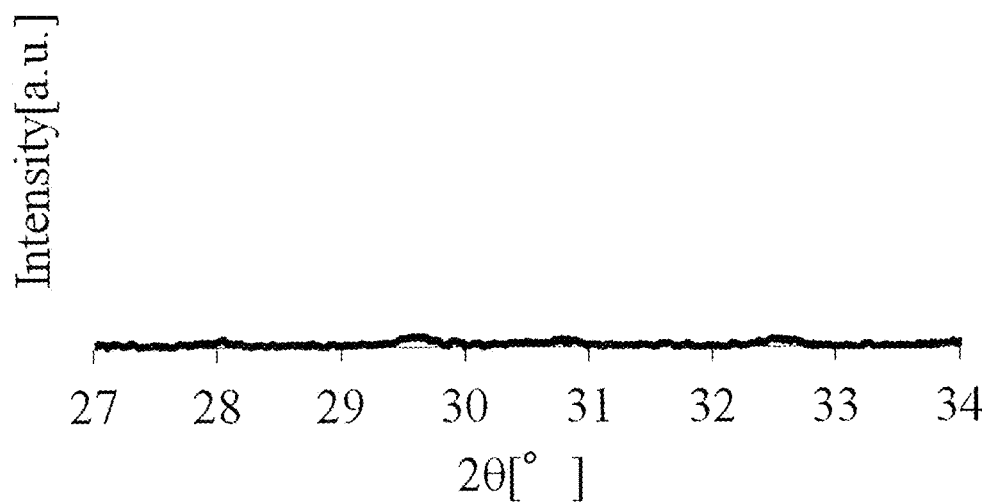
FIG. 5 is a profile determined by XRD (X-ray diffractometry) of a semiconductive ceramic sintered compact according to the present invention prepared in Example 11.

FIG. 5 is a graph showing the results of measurement by powder X-ray diffractometry of a sample obtained by pulverizing the semiconductive ceramic sintered compact with MgO added thereto in Example 11, adding 1% by weight of a Si powder having a purity of 99.9999% or more to the powder, and mixing them together. A peak attributable to the ilmenite crystal phase should be observed at around 32.1°. However, the precipitation of the ilmenite crystal phase could not be observed.

Figure 6:
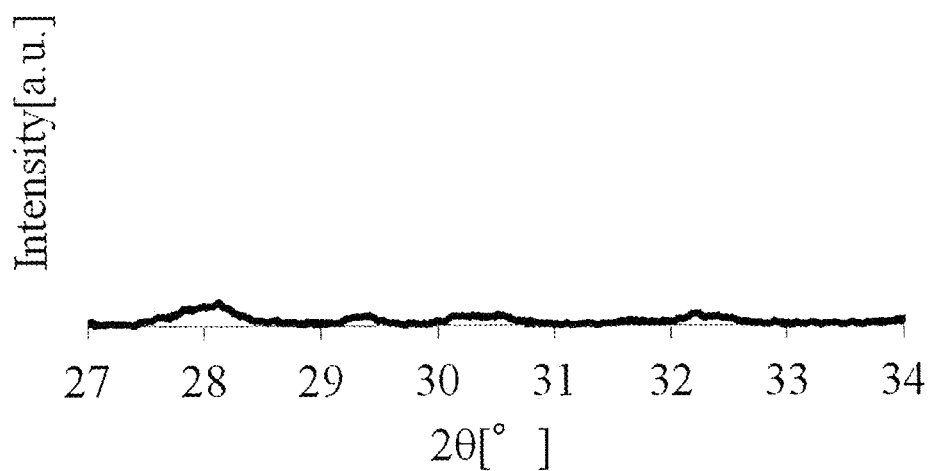
FIG. 6 is a profile determined by XRD (X-ray diffractometry) of a semiconductive ceramic sintered compact according to the present invention prepared in Example 12.

FIG. 6 is a graph showing the results of measurement by powder X-ray diffractometry of a sample obtained by pulverizing the semiconductive ceramic sintered compact with CaO added thereto in Example 12, adding 1% by weight of a Si powder having a purity of 99.9999% or more to the powder, and mixing them together. A peak attributable to the ilmenite crystal phase should be observed at around 32.1°. The peak at around 32° had a very weak peak intensity and was broad. That is, the precipitation of the ilmenite crystal phase was hardly observed.

For Comparative Examples 1 and 2, the composition of the conductive phase satisfied neither Mn/(Ti+Mn+Fe)>0.08 nor Mn/Ti>0.15, and the surface resistivity was high and poor. For Comparative Example 3, the composition of the conductive phase satisfied neither Mn/(Ti+Mn+Fe)>0.08 nor Mn/Ti>0.15, and the water absorption coefficient was high and poor.

What is claimed is:

1. A semiconductive ceramic sintered compact comprising:
a main phase, a conductive phase, and $SiO_2$, wherein
the main phase is a ceramic sintered phase comprising $Al_2O_3$ particles,
an area ratio of the conductive phase to the main phase is 0% (exclusive) to 10% (inclusive), and
the conductive phase comprises two or more metals selected from Mn (manganese), Fe (iron), and Ti (titanium) and has a composition meeting a relation of Mn/(Ti+Mn+Fe)>0.08 or Mn/Ti>0.15.

2. The semiconductive ceramic sintered compact according to claim 1, wherein the conductive phase contains Fe and Ti.

3. The semiconductive ceramic sintered compact according to claim 2, wherein the conductive phase further contains Mn.

4. The semiconductive ceramic sintered compact according to claim 1, wherein the conductive phase contains Mn and Ti.

5. The semiconductive ceramic sintered compact according to claim 1, which has a surface resistivity of not more than $10^{13}$ [Ω/sq.].

6. The semiconductive ceramic sintered compact according to claim 5, the surface resistivity is measured under an environment of a temperature of 23±1° C. and a humidity of not more than 50%.

7. The semiconductive ceramic sintered compact according to claim 1, which has a specific modulus of rigidity of not less than 60 [GPa].

8. The semiconductive ceramic sintered compact according to claim 1, which has a water absorption coefficient of not more than 0.1%.

9. A structural member for a liquid crystal or semiconductor manufacturing apparatus, the structural member being formed of a semiconductive ceramic sintered compact according to claim 1.

10. The semiconductive ceramic sintered compact according to claim 1, wherein the amount of $SiO_2$ is not more than 10% by weight.

11. The semiconductive ceramic sintered compact according to claim 1, wherein the amount of $SiO_2$ is not more than 8% by weight.

12. The semiconductive ceramic sintered compact according to claim 1, wherein the amount of $SiO_2$ is not more than 6% by weight.

13. The semiconductive ceramic sintered compact according to claim 1, which was obtained by sintering in the atmospheric environment.

14. The semiconductive ceramic sintered compact according to claim 1, wherein $SiO_2$ is added in the form of particles.

* * * * *